US012417020B2

(12) United States Patent
Sheng et al.

(10) Patent No.: US 12,417,020 B2
(45) Date of Patent: Sep. 16, 2025

(54) MEMORY DEVICE, MEMORY SYSTEM, AND METHOD FOR DATA CALCULATION WITH THE MEMORY DEVICE

(71) Applicant: YANGTZE MEMORY TECHNOLOGIES CO., LTD., Wuhan (CN)

(72) Inventors: Yue Sheng, Wuhan (CN); Shu Xie, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 18/415,230

(22) Filed: Jan. 17, 2024

(65) Prior Publication Data

US 2025/0217034 A1  Jul. 3, 2025

Related U.S. Application Data

(63) Continuation of application No. PCT/CN2023/142309, filed on Dec. 27, 2023.

(51) Int. Cl.
*G06F 3/06* (2006.01)

(52) U.S. Cl.
CPC ............ *G06F 3/061* (2013.01); *G06F 3/0655* (2013.01); *G06F 3/0679* (2013.01)

(58) Field of Classification Search
None
See application file for complete search history.

(56) References Cited

U.S. PATENT DOCUMENTS

| 11,836,102 | B1 | 12/2023 | Mathuriya |
| 2018/0232273 | A1 | 8/2018 | Plants |
| 2018/0240510 | A1* | 8/2018 | Hush ...................... G11C 5/025 |
| 2019/0042199 | A1 | 2/2019 | Sumbul et al. |
| 2019/0317857 | A1 | 10/2019 | Khan et al. |
| 2020/0117989 | A1* | 4/2020 | Huang ................ G06F 13/1673 |
| 2020/0243154 | A1 | 7/2020 | Sity et al. |
| 2023/0068645 | A1 | 3/2023 | Fujiwara et al. |

(Continued)

FOREIGN PATENT DOCUMENTS

| KR | 10-2005-0022855 A | 3/2005 | |
| KR | 10-2023-0014614 A | 1/2023 | |
| WO | WO-2021257609 A2 * | 12/2021 | ......... G06F 12/0207 |

OTHER PUBLICATIONS

International Search Report issued in corresponding International Application No. PCT/CN2023/142309, mailed on Jun. 28, 2024, 3 pages.

(Continued)

*Primary Examiner* — Michael Alsip
(74) *Attorney, Agent, or Firm* — BAYES PLLC

(57) ABSTRACT

A memory device, a memory system, and a method for data calculation with the memory device are provided. The memory device includes an array of memory cells and a peripheral circuit coupled to the memory cells is provided. The peripheral circuit includes a control logic configured to program first data and second data into different banks of the banks of memory cells, at least one process unit configured to perform calculation based on the first data and the second data, and a data-path bus coupled to the control logic and the at least one process unit to transmit the first date and the second data.

20 Claims, 14 Drawing Sheets

(56) References Cited

U.S. PATENT DOCUMENTS

| | | |
|---|---|---|
| 2023/0206967 A1 | 6/2023 | Park |
| 2023/0317122 A1 | 10/2023 | Hung et al. |
| 2023/0343373 A1 | 10/2023 | Skadron |
| 2024/0143541 A1 | 5/2024 | Fouda et al. |
| 2024/0257842 A1 | 8/2024 | Tanaka |

OTHER PUBLICATIONS

International Search Report issued in corresponding International Application No. PCT/CN2023/142312 mailed on Jun. 28, 2024, 3 pages.

International Search Report issued in corresponding International Application No. PCT/CN2023/142313 mailed on Jun. 28, 2024, 3 pages.

* cited by examiner

MEMORY DEVICE, MEMORY SYSTEM, AND METHOD FOR DATA CALCULATION WITH THE MEMORY DEVICE

CROSS-REFERENCE TO RELATED APPLICATIONS

This application is a continuation of International Application No. PCT/CN2023/142309, filed on Dec. 27, 2023, entitled "MEMORY DEVICE, MEMORY SYSTEM, AND METHOD FOR DATA CALCULATION WITH THE MEMORY DEVICE," which is incorporated herein by reference in its entirety.

BACKGROUND

The present disclosure relates to a memory device, a memory system, and a method for data calculation with the memory device.

Generative artificial intelligence (AI) reasoning involves AI computation. For example, transformer models usually use a tensor processing unit (TPU) and a memory for computation. Large transformer models require a large amount of data and computation, which requires high power consumption and sufficient memory. When an access speed of memory lags behind the computation speed of the processor, a memory bottleneck will prohibit high-performance processors playing effectively, and forms a great constraint to high-performance computing (HPC), this problem is called the memory wall. It is desired to break through the memory wall to further improve the performance of AI systems.

SUMMARY

In one aspect, a memory device including banks of memory cells and a peripheral circuit coupled to the banks of memory cells is provided. The peripheral circuit includes a control logic configured to program first data and second data into different banks of the banks of memory cells, at least one process unit coupled to the banks of memory cells via a data-path bus of the peripheral circuit, and configured to perform calculation based on the first data and the second data In some implementations, the first data includes at least one row. The control logic is configured to receive the first data from a data interface and program each row of the first data into one bank of the banks of memory cells based on a first data pattern.

In some implementations, the first data pattern includes N first data segments with equal data length, where N is a positive integer and N≥2. a sequence of the N first data segments of the first data pattern is same with a sequence of the first data.

In some implementations, the data length of each first data segment is less than or equal to a bandwidth of the data-path bus.

In some implementations, the second data includes M columns, where M is a positive integer and M≥2. The control logic is configured to program each column of the M columns into the M banks of memory cells of the banks of memory cells based on a second data pattern, a number of the banks of memory cells is larger than M.

In some implementations, the second data pattern includes N data groups each having M second data segments with equal data length from the M columns of the second data respectively. The first data segment and the second data segment are configured to share an equal data length.

In some implementations, each second data segment of the M second data segments of each data group of the second data is assigned with an error checking and correcting (ECC) code.

In some implementations, the data length of each second data segment is less than or equal to a bandwidth of the data-path bus.

In some implementations, the control logic is configured to receive the second data from the data interface of the memory device based on the second data pattern.

In some implementations, each of the at least one process unit includes M process elements configured to perform convolution operations based on an ith first data segment of the N first data segments and the M second data segments of an ith data group of the N data groups, where i is a positive integer and N≥i≥1.

In some implementations, the control logic is configured to control the one bank of the banks of memory cells to send the ith first data segment of the first data to each process element of the M process elements. The control logic is further configured to control the M banks of memory cells to send the M second data segments to the M process elements.

In some implementations, each of the at least one process unit includes a control element configured to assign the M second data segments to the M process elements correspondingly based on the sequence of the second data.

In some implementations, the control logic is configured output the calculation result to a data interface of the peripheral circuit of the memory device.

In some implementations, the control logic is configured to output the calculation result into the banks of memory cells.

In some implementations, a number of the at least one process unit is equal to a number of the banks of memory cells Each process unit corresponds to a corresponding one of the banks of memory cells respectively.

In some implementations, a number of the at least one process unit is less than a number of the banks of memory cells.

In some implementations, a number of the at least one process unit is half of the number of the banks of memory cells, and one process unit corresponds to two banks of memory cells respectively.

In some implementations, a number of the at least one process unit is a quarter of the number of the banks of memory cells, and one process unit corresponds to four banks of memory cells respectively.

In some implementations, a number of the at least one process unit is one and one process unit corresponds to the banks of memory cells.

In some implementations, the memory device includes dynamic random-access memory (DRAM).

In another aspect, a method for data calculation with a memory device including a banks of memory cells and a peripheral circuit coupled to the banks of memory cells is provided. The method includes obtaining, by a control logic of the peripheral circuit via a data-path bus of the peripheral circuit, first data and second data from a data interface of the memory device; programming the first data and second data into the banks of memory cells; and performing calculation, by at least one process unit of the peripheral circuit, based on the first and the second data.

In some implementations, the first data includes at least one row. Programming the first data and second data into the banks of memory cells includes programming each row of the first data into one memory bank of banks of memory cells based on a first data pattern.

In some implementations, the first data pattern includes N first data segments with equal data length, where N is a positive integer and N≥2. A sequence of the N first data segments of the first data pattern is same with a sequence of the first data.

In some implementations, the data length of each first data segment is less than or equal to a bandwidth of the data-path bus.

In some implementations, the second data includes M columns, where M is a positive integer and M≥2, and obtaining the second data from the data interface of the memory device includes programming each column of the M columns into M banks of memory cells of the M banks of memory cells based on a second data pattern, a number of the banks of memory cells is larger than M.

In some implementations, the second data pattern includes N data groups each having M second data segments with equal data length from the M columns of the second data respectively. The first data segment and the second data segment are configured to share an equal data length.

In some implementations, obtaining the second data from the data interface of the memory device includes assigning an error checking and correcting (ECC) code to each second data segment of the M second data segments of each data group of the second data.

In some implementations, the data length of each second data segment is less than or equal to a bandwidth of the data-path bus.

In some implementations, performing calculation based on the first and the second data includes performing, by each M process elements of the at least one process unit, convolution operations based on an ith first data segment of the N first data segments and the M second data segments of an ith data group of the N data groups, where i is a positive integer and N≥i≥1.

In some implementations, performing calculation based on the first and the second data includes sending the ith first data segment of the first data from the one memory bank to each process element of the M process elements; and sending, the M second data segments from the M banks of memory cells to the M process elements.

In some implementations, the method further includes outputting a calculation result to the banks of memory cells of the data interface of the peripheral circuit of the memory device.

In yet another aspect, a system including a memory device and a controller is provided. The memory device includes banks of memory cells and a peripheral circuit coupled to the memory cells. The peripheral circuit includes a control logic configured to program first data and second data into the memory banks; at least one process unit coupled to the banks of memory cells via a data-path bus of the peripheral circuit, and configured to perform calculation based on the first data and the second data. The controller is coupled with the memory device and configured to transmit the first data into the memory device and receive a result of the calculation from the memory device.

In some implementations, the controller is further configured to transmit the second data into the memory device.

In some implementations, the memory device includes dynamic random-access memory (DRAM).

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Generative artificial intelligence (AI) reasoning involves AI computation. For example, transformer models, as a common model in AI systems, usually use a tensor processing unit (TPU) and a memory for computation. Large transformer models require a large amount of data and computation, which requires high power consumption and sufficient memory. When an access speed of memory lags behind the computation speed of the processor, a memory bottleneck will prohibit high-performance processors playing effectively, and forms a great constraint to high-performance computing (HPC), this problem is called the memory wall.

Figure 1A:
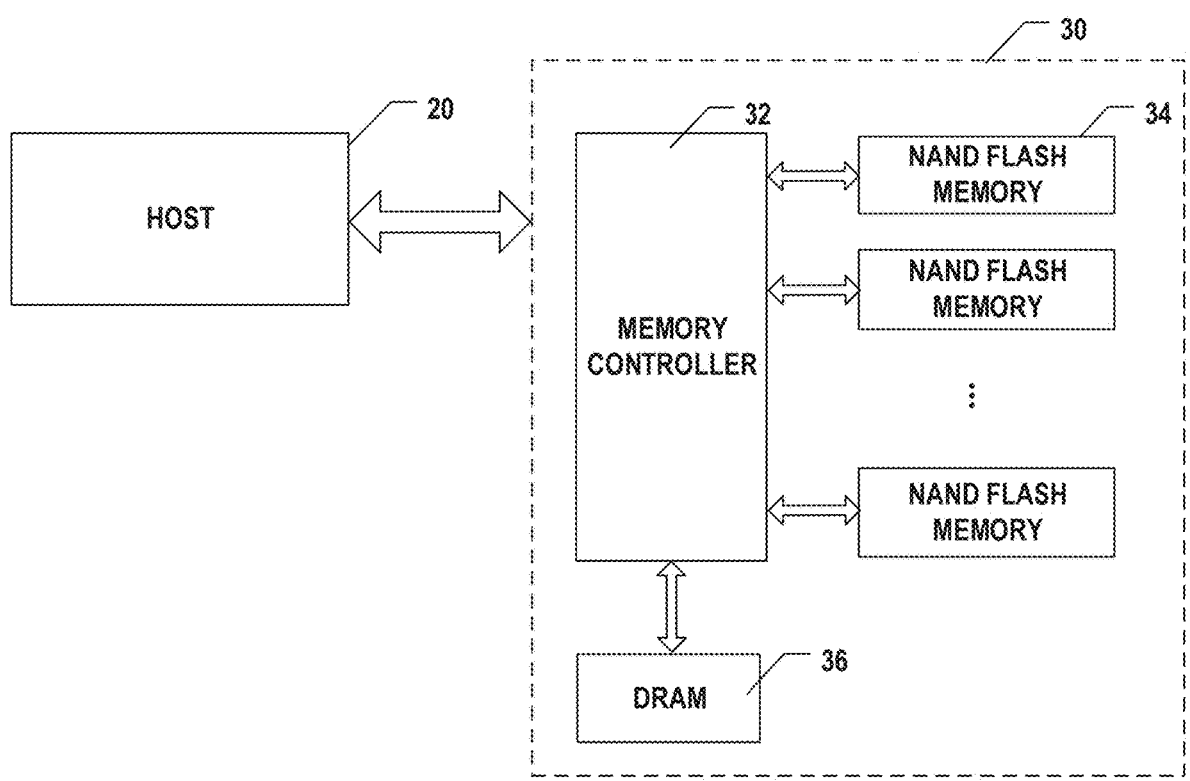
FIG. 1A illustrates a block diagram of a system having a memory device, according to some aspects of the present disclosure.

To address one or more aforementioned issues and break the memory wall, the present disclosure introduces a solution in which a memory device and a method for calculation with the memory device is provided. The process units are provided in a peripheral circuit of the memory device to perform calculations under the control of a control logic of the peripheral circuit. In this way, part of calculation tasks of the AI system can be distributed to the memory device of the AI system, especially tasks requiring large data-width. Without transferring the large data from the memory device to a processor of the AI system to perform calculations, the calculation tasks are completed within the memory device while the processor can process other calculations. Therefore, the calculation speed of the AI system is effectively improved by the introduction of the process units in the memory device. FIG. 1A illustrates a block diagram of a system 10 having a host 20 and a memory system 30, according to some aspects of the present disclosure. System 10 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, an artificial intelligence (AI) device, or any other suitable electronic devices having storage therein. As shown in FIG. 1A, system 10 can include a host 20 and a memory system 30 having one or more non-volatile memory devices 34 (e.g., NAND flash memory in FIG. 1A), one or more volatile memory devices 36 (e.g., DRAM in FIG. 1A), and a memory controller 32.

Memory system 30 may be configured to sense, read, program, and store data under the control of host 20. Memory controller 32 can provide a physical connection between host 20 and memory system 30. That is, memory controller 32 can provide a data interface between the host and memory system 30 in accordance with the format of a data-bus of the host. Memory controller 32 may decode instructions provided from host 20 and access the one or more non-volatile memory devices 34. The one or more volatile memory devices 36 can be configured as a cache to temporarily store programming data provided from the host, or data reading from the non-volatile memory devices 34. When a read request is sent from host 20, volatile memory devices 36 may send the cached data directly to host 20 if the requested data in the non-volatile memory device 34 is cached in volatile memory devices 36. A data transferring speed between volatile memory devices 36 and host 20 through data-bus of host 20 is much higher than a data transferring speed between non-volatile memory device 34 and host 20. By introducing volatile memory devices 36, performance degradation of system 10 due to speed difference between host 20 and non-volatile memory device 34 can be minimized. In some implementations, volatile memory devices 36 can also be configured to store a mapping table between logical addresses and physical addresses of data saved in non-volatile memory device 34. In some implementations, memory controller 32 may communicate with volatile memory device 36 using at least one communication protocol or technical standard commonly associated with, for example, dual in-line memory modules (DIMMs), DIMMs with registers (RDIMMs), low load DIMMs (LRDIMMs), DIMMs without registers (UDIMMs), and the like.

In some implementations, host 20 can be a processor of an electronic device, such as a tensor processing unit (TPU), a central processing unit (CPU), or a system-on-chip (SoC), such as an application processor (AP). Host 20 can be configured to send or receive data to or from memory system 30. Non-volatile memory device 34 may include, but not limited to, NAND flash memory, Resistive Random Access Memory (RRAM), Nano Random Access Memory (NRAM), Phase Change Random Access Memory (PCRAM), Ferroelectric Random Access Memory (FRAM), Magneto resistive Random Access Memory (MRAM), and so on. Volatile memory device 36 can include, but not limited to, Dynamic Random Access Memory (DRAM), Static Random Access Memory (SRAM), and so on, and so on.

Memory controller 32 is coupled to non-volatile memory device 34 and host 20 and is configured to control non-volatile memory device 34, according to some implementations. Memory controller 32 can manage the data stored in non-volatile memory device 34 and communicate with host 20. In some implementations, memory controller 32 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 32 is designed for operating in a high duty-cycle environment SSDs or embedded multi-media-cards (eMMCs) used as data storage for mobile devices, such as smartphones, tablets, laptop computers, etc., and enterprise storage arrays. Memory controller 32 can be configured to control operations of non-volatile memory device 34, such as read, erase, and program operations. Memory controller 32 can also be configured to manage various functions with respect to the data stored or to be stored in non-volatile memory device 34 including, but not limited to bad-block management, garbage collection, logical-to-physical address conversion, wear leveling, etc. In some implementations, memory controller 32 is further configured to process error checking and correcting (ECC) codes with respect to the data read from or written to non-volatile memory device 34. Any other suitable functions may be performed by memory controller 32 as well, for example, formatting non-volatile memory device 34. Memory controller 32 can communicate with an external device (e.g., host 20) according to a particular communication protocol. For example, memory controller 32 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 1B:
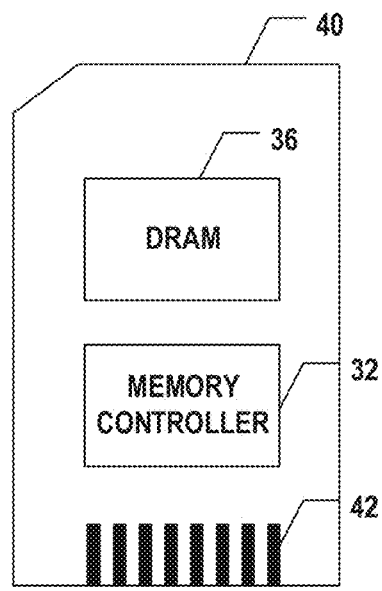
FIG. 1B illustrates a diagram of a memory card having a memory device, according to some aspects of the present disclosure.
Figure 1C:
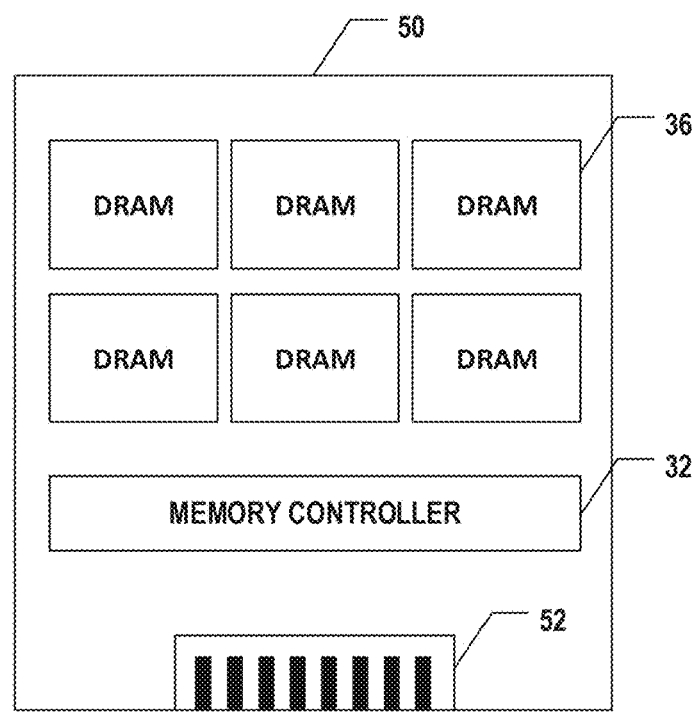
FIG. 1C illustrates a diagram of a solid-state drive (SSD) having a memory device, according to some aspects of the present disclosure.

Memory controller 32 and one or more non-volatile memory devices 34 can be integrated into various types of storage devices, for example, be included in the same package, such as a universal Flash storage (UFS) package or an eMMC package. That is, memory system 30 can be implemented and packaged into different types of end electronic products. In one example as shown in FIG. 1B, memory controller 32 and a single volatile memory device 36 may be integrated into a memory card 40. Memory card 40 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 40 can further include a memory card connector 42 coupling memory card 40 with a host (e.g., host 20 in FIG. 1A). In another example as shown in FIG. 1C, memory controller 32 and multiple volatile memory devices 36 may be integrated into an SSD 50. SSD 50 can further include an SSD connector 52 coupling SSD 50 with a host (e.g., host 20 in FIG. 1A). In some implementations, the storage capacity and/or the operation speed of SSD 50 is higher than those of memory card 40.

Figure 1D:
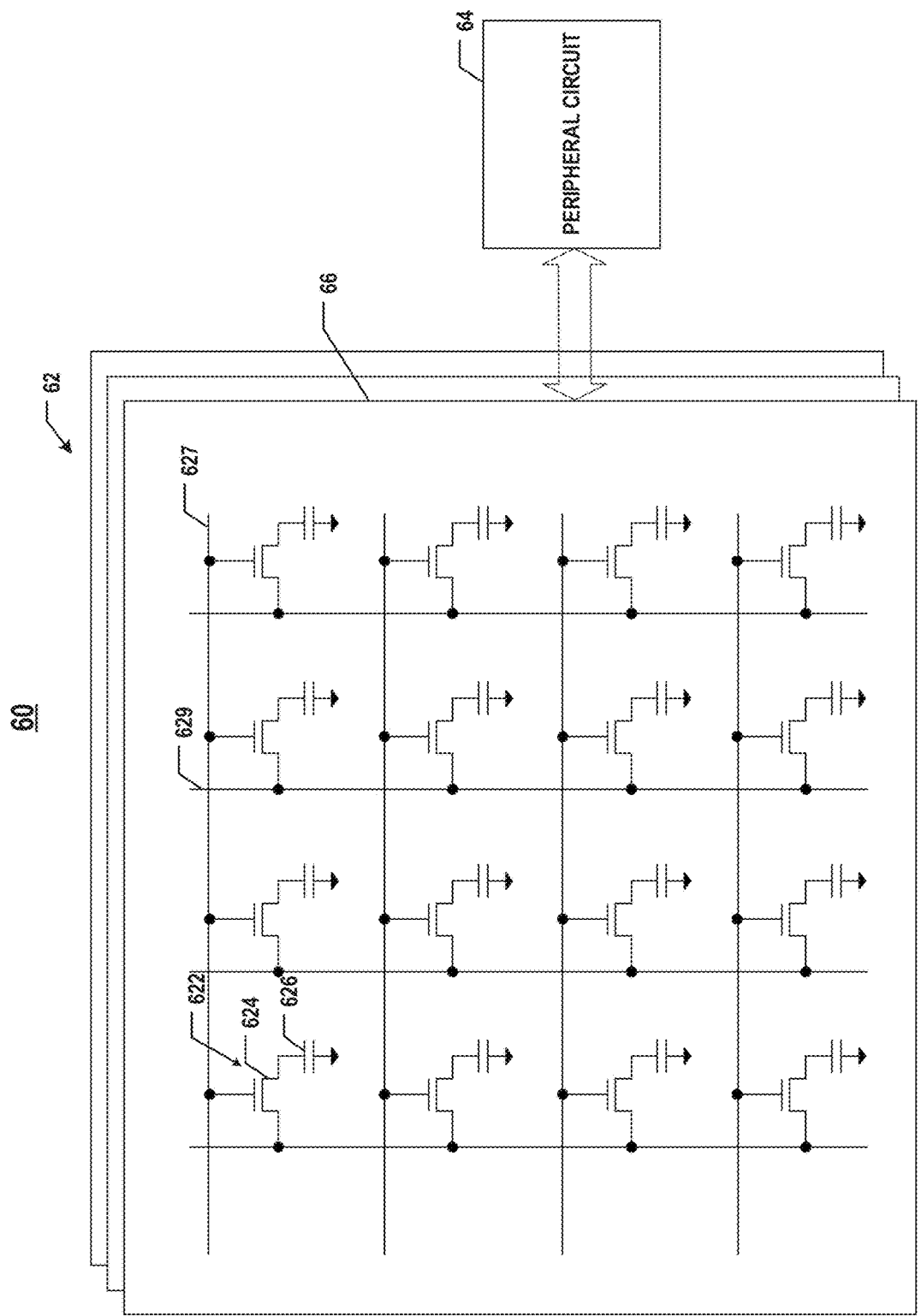
FIG. 1D illustrates a schematic diagram of a memory device including peripheral circuits, according to some aspects of the present disclosure.

FIG. 1D illustrates a schematic diagram of a memory device 60 including a memory cell array 62 and peripheral circuits 64 coupled to memory cell array 62. Memory cell array 62 can include banks 66 of memory cells. Each bank of memory cells 66 can include memory cells 622. Each memory cell 622 includes a transistor 624 and a storage unit 626 coupled to vertical transistor 624. In some implementations, memory cell array 62 is a DRAM cell array, and storage unit 626 is a capacitor for storing charge as the binary information stored by the respective DRAM cell. In some implementations, memory cell array 62 is a PCM cell array, and storage unit 626 is a PCM element (e.g., including chalcogenide alloys) for storing binary information of the respective PCM cell based on the different resistivities of the PCM element in the amorphous phase and the crystalline phase. In some implementations, memory cell array 62 is a FRAM cell array, and storage unit 626 is a ferroelectric capacitor for storing binary information of the respective FRAM cell based on the switch between two polarization states of ferroelectric materials under an external electric field.

As shown in FIG. 1D, memory cells 622 can be arranged in a two-dimensional (2D) array having rows and columns. Memory device 60 can include word lines 627 coupling peripheral circuits 64 and memory cell array 62 for controlling the switch of transistors 624 in memory cells 622 located in a row, as well as bit lines 629 coupling peripheral circuits 64 and memory cell array 62 for sending data to and/or receiving data from memory cells 622 located in a column. That is, each word line 627 is coupled to a respective row of memory cells 622, and each bit line 629 is coupled to a respective column of memory cells 622.

Storage unit 626 can include any devices that are capable of storing binary data (e.g., 0 and 1), including but not limited to, capacitors for DRAM cells and FRAM cells, and PCM elements for PCM cells. In some implementations, transistor 624 controls the selection and/or the state switch of the respective storage unit 626 coupled to transistor 624. Peripheral circuits 64 can be coupled to memory cell array 62 through bit lines 629, word lines 627, and any other suitable metal wirings. As described above, peripheral circuits 64 can include any suitable circuits for facilitating the operations of memory cell array 62 by applying and sensing voltage signals and/or current signals through word lines 627 and bit lines 629 to and from each memory cell 622. Peripheral circuits 64 may include any suitable analog, digital, and mixed-signal circuitry for facilitating the associated operation of the array of memory cells by applying voltage signals and/or current signals to and sensing voltage signals and/or current signals from each target memory cell. In addition, peripheral circuits 64 may include various types of peripheral circuits formed using metal-oxide-semiconductor (MOS) technology.

Figure 1E:
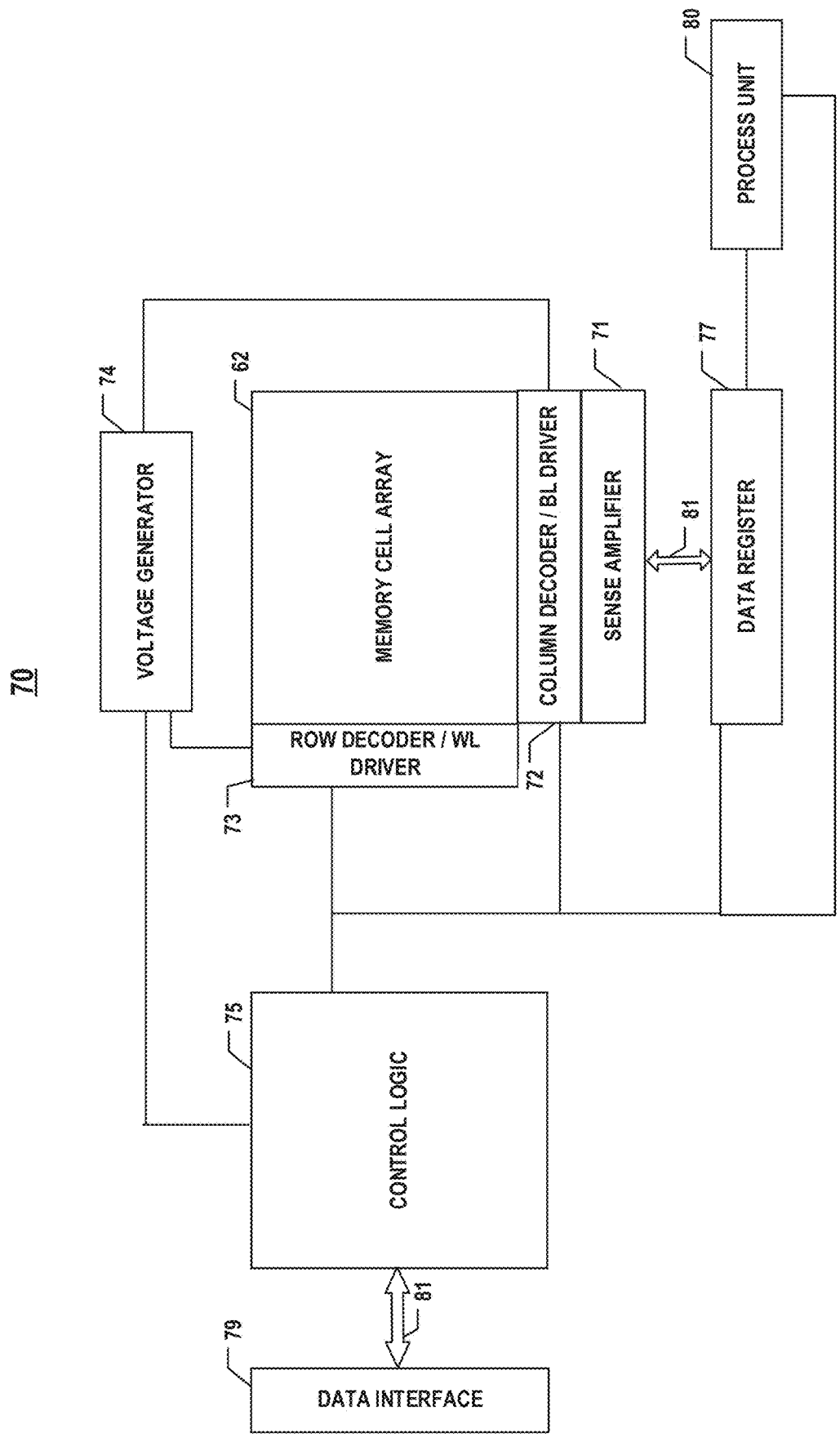
FIG. 1E illustrates a block diagram of a memory device including a memory cell array and peripheral circuits, according to some aspects of the present disclosure.

Referring to FIG. 1E, peripheral circuit 64 includes a sense amplifier 71, a column decoder/bit line driver 72, a row decoder/word line driver 73, a voltage generator 74, a control logic 75, an address register 76, a data register 77, a data interface 79, a process unit 80, and a data-path bus 81. It should be understood that the above peripheral circuit 70 may be the same as the peripheral circuit 64 in FIG. 1D and in some other examples, peripheral circuit 70 may also include additional peripheral circuitry not shown in FIG. 1E.

Sense amplifier 71 can be configured to read data from memory cell array 62 according to the control signals from control logic 75. Column decoder/bit line driver 72 can be configured to be controlled by control logic 75 and select one or more memory cells by applying bit line voltages generated from voltage generator 74.

Row decoder/word line driver 73 can be configured to be controlled by control logic 75 and select/deselect banks 66 of memory cells of memory cell array 62 and select/deselect word lines of bank of memory cells 66. Row decoder/word line driver 73 can be further configured to drive word lines using word line voltages generated from voltage generator 74. As described below in detail, row decoder/word line driver 73 is configured to apply a read voltage to selected word line in a read operation on memory cell coupled to selected word line.

Voltage generator 74 can be configured to be controlled by control logic 75 and generate the word line voltages (e.g., read voltage, program voltage, refresh voltage, etc.), bit line voltages, and source line voltages to be supplied to memory cell array 62.

Control logic 75 can be coupled to each peripheral circuit described above and configured to control operations of each peripheral circuit. Address register 76 and data register 77 can be coupled to control logic 75 and configured for storing status information, command operation codes (OP codes), and command addresses for controlling the operations of each peripheral circuit. Data interface 79 can be coupled to control logic 75 through a data-path bus 81 and act as a control buffer to buffer and relay control commands received from a host (not shown) to control logic 75 and status information received from control logic 75 to the host. Data interface 79 can also be coupled to column decoder/bit line driver 72 and act as a data input/output (I/O) interface and a data buffer to buffer and relay the data to and from memory cell array 62.

Figure 1F:
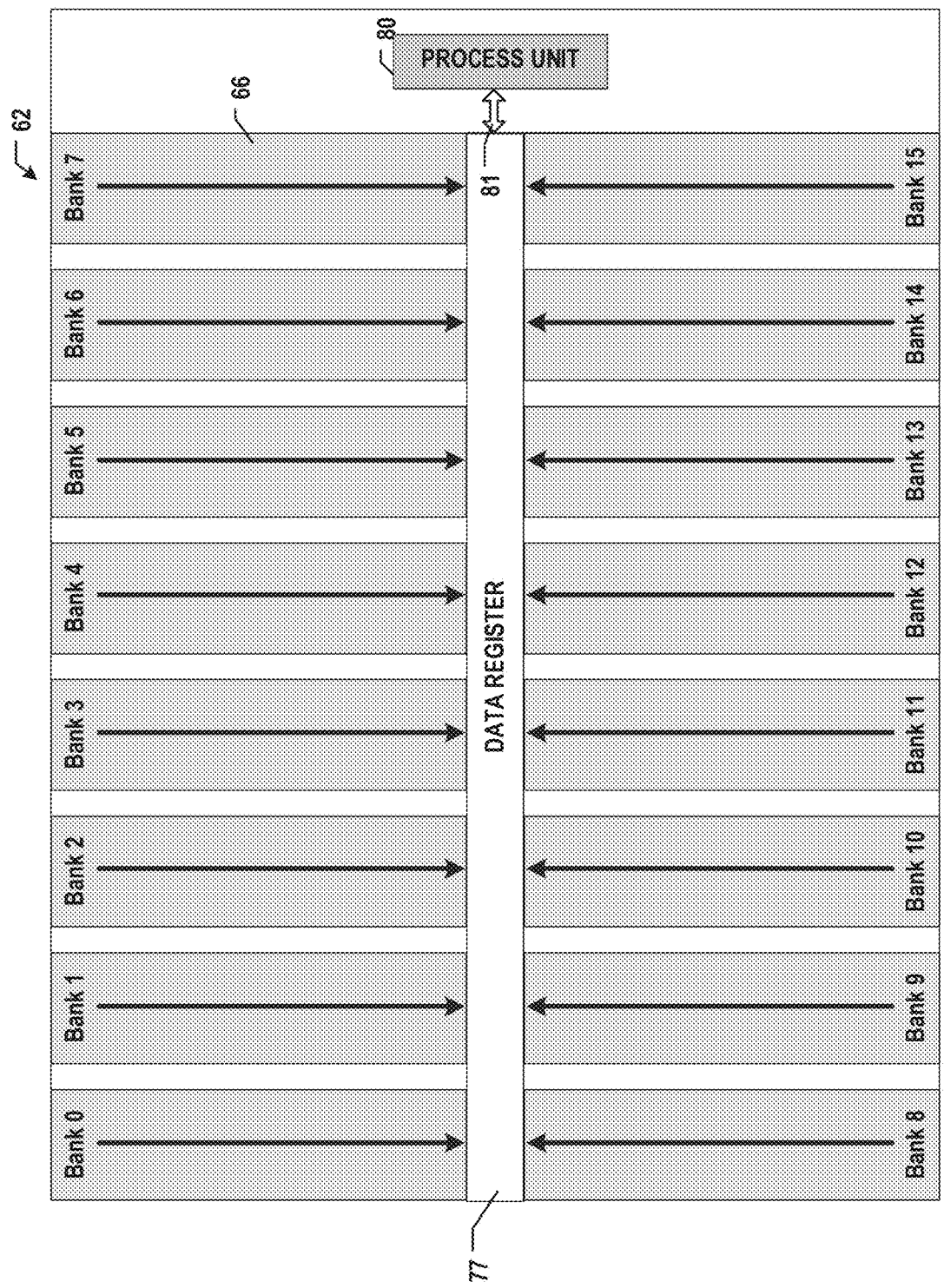
FIG. 1F illustrates a block diagram of a memory cells array and at least one process unit, according to some aspects of the present disclosure.

As shown in FIG. 1F, memory cells array 62 includes banks 66 of memory cells coupled to the at least one process unit 80 via data register 77 and data-path bus 81 of peripheral circuit 64. For example, in present implementation, each memory cell array 62 can include sixteen banks 66 of memory cells as shown in FIG. 1F. The plurality of banks 66 of memory cells can be coupled with peripheral circuit 64 through data-path bus 81. First data and second data can be programmed into the plurality of banks 66 of memory cells before performing calculation.

In some implementations, a number of the at least one process unit 80 is equal to a number of the banks 66 of memory cells, and each process unit 80 corresponds to a corresponding one of the banks of memory cells respectively, for example, in FIG. 1F, the number of process units 80 may be sixteen. In some implementations, a number of the at least one process unit 80 is less than a number of the banks 66 of memory cells. In some implementations, a number of the at least one process unit 80 is half of the number of the banks of memory cells, and each process unit 80 corresponds to two corresponding banks of memory cells respectively. For example, in FIG. 1F, the number of process units 80 may be eight. In some implementations, a number of the at least one process unit 80 is a quarter of the number of the banks of memory cells and each process unit 80 corresponds to four corresponding banks 66 of memory cells respectively. For example, in FIG. 1F, the number of process units 80 may be four. The number of the process units 80 may be designed as need in practice, the above implementations in the present disclosure aim to illustrate and shall not be explained as limitations of the present disclosure.

Figure 1G:
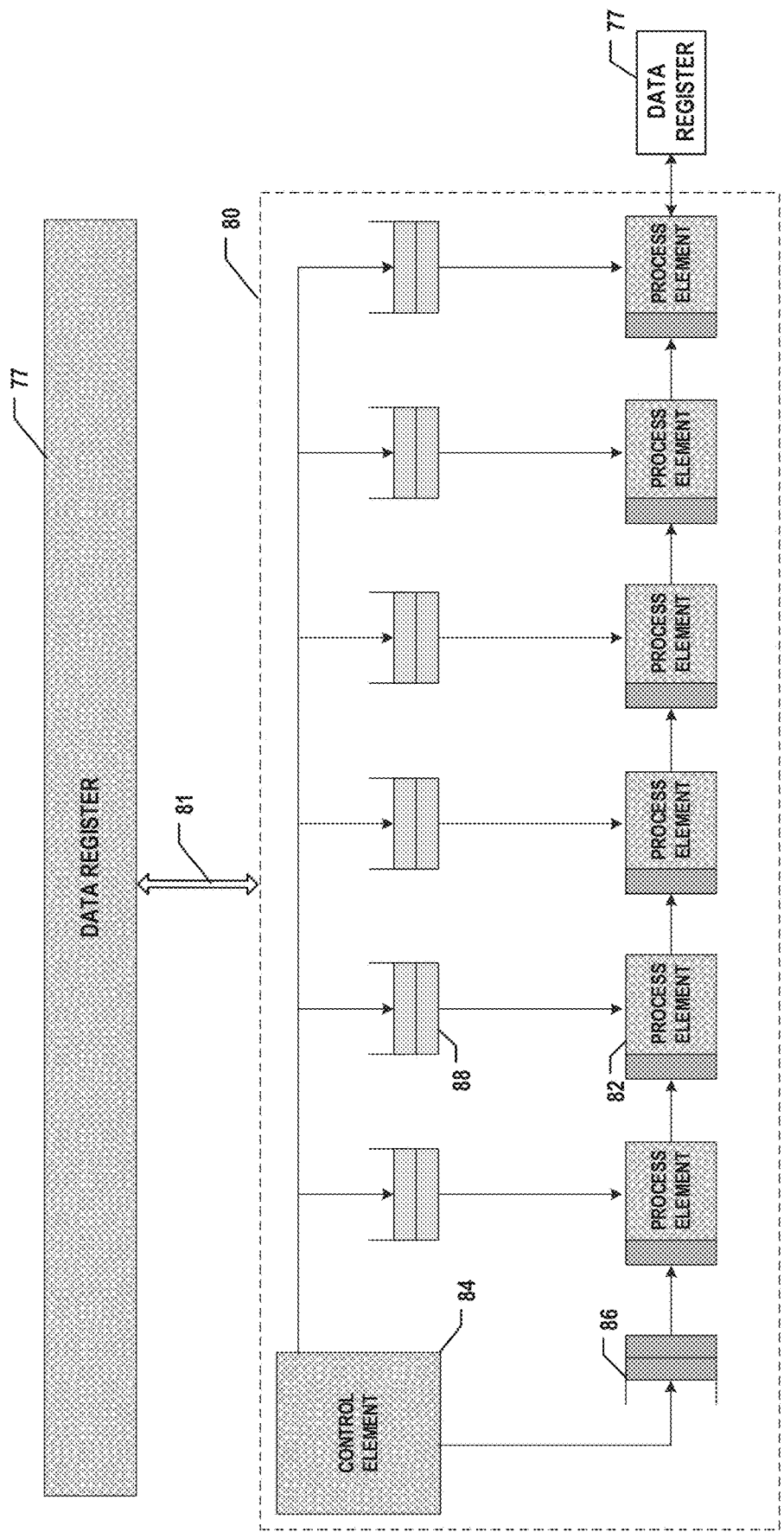
FIG. 1G illustrates a block diagram of at least one process unit, according to some aspects of the present disclosure.

Referring to FIG. 1G, process unit 80 includes a plurality of process elements 82, a control element 84, a plurality of first registers 86, and a plurality of second registers 88 is illustrated. Process unit 80 can be coupled with memory cell array 62 through first registers 86 and second registers 88 to receive the first data and the second data from the plurality of banks of memory cells of memory cell array 62. The plurality of process elements 82 coupled with the first registers 86 and second registers 88 and configured to perform convolution calculation based on the first data and the second data. In some implementations, each process element 82 can be provided with a corresponding result register configured to save the calculation results of process element 82. A number of process element 82 equals a number of second registers 88 and a number of the columns of the second data. In the present implementation, each process unit includes six process elements 82 and six second registers 88 as shown in FIG. 1G. Control element 84 is configured to assign the first data and the second data to the plurality of process elements 82 according to preset data patterns. In some implementations, a number of the at least one first registers 86 equals to a number of rows of the first data. For example, in the present implementation, each process unit 80 includes one first register 86. In some implementations, first registers 86 and the second registers 88 are first-in-first-out (FIFO) registers.

Figures 2A, 2B:
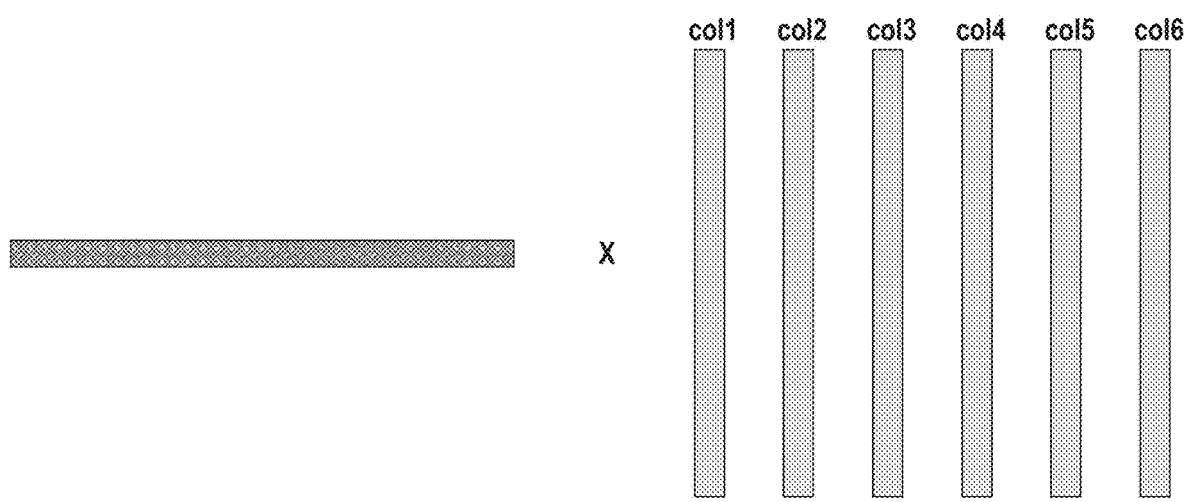
FIG. 2A illustrates first and second data processed by a memory device, according to some aspects of the present disclosure.
FIG. 2B illustrates data shapes of the first and second data in FIG. 2A, according to some aspects of the present disclosure.

AI systems are mainly used in two aspects: training and inference, and the present disclosure can be mainly used in AI inference, in which data in input into a trained AI module to be recognized and analyzed to obtain an expected result of the input data. In AI inference, calculations are performed based on the input data and data prestored in the AI system to confirm one or more nature of the input data. In AI inference, the input data may be one-dimensional data and the reference data may be two-dimensional data in many cases, as shown in FIG. 2A, in which the first data is a one-dimensional vector, and the second data is a two-dimensional matrix. In Ai systems, three modules are provided to perform data calculations. The first module is computing near memory device, in which the calculations are performed outside the memory device. The second module is computing in memory cells, in which the calculations are performed by the memory cells of the memory device. The third module is processing in memory cells, in which the calculations are performed by additional process units of the memory device. The third module, i.e., processing in memory cells, is employed in the implementations of the present disclosure.

FIG. 2B illustrates equivalence shapes of the first data and the second data in FIG. 2A. In some implementations, the one-dimensional first data can be equivalated as a row of data with a length of a, and the two-dimensional second data, i.e., the a×b matrix, can be equivalated as b columns, each column has a length of a. In some implementations, the first data can be a two-dimensional matrix including more than one row with an equal data length, and a dimensionality reduction can be performed on the more than one row of the first data to break the first data into a plurality of single row to apply the present disclosure.

Figure 2C:
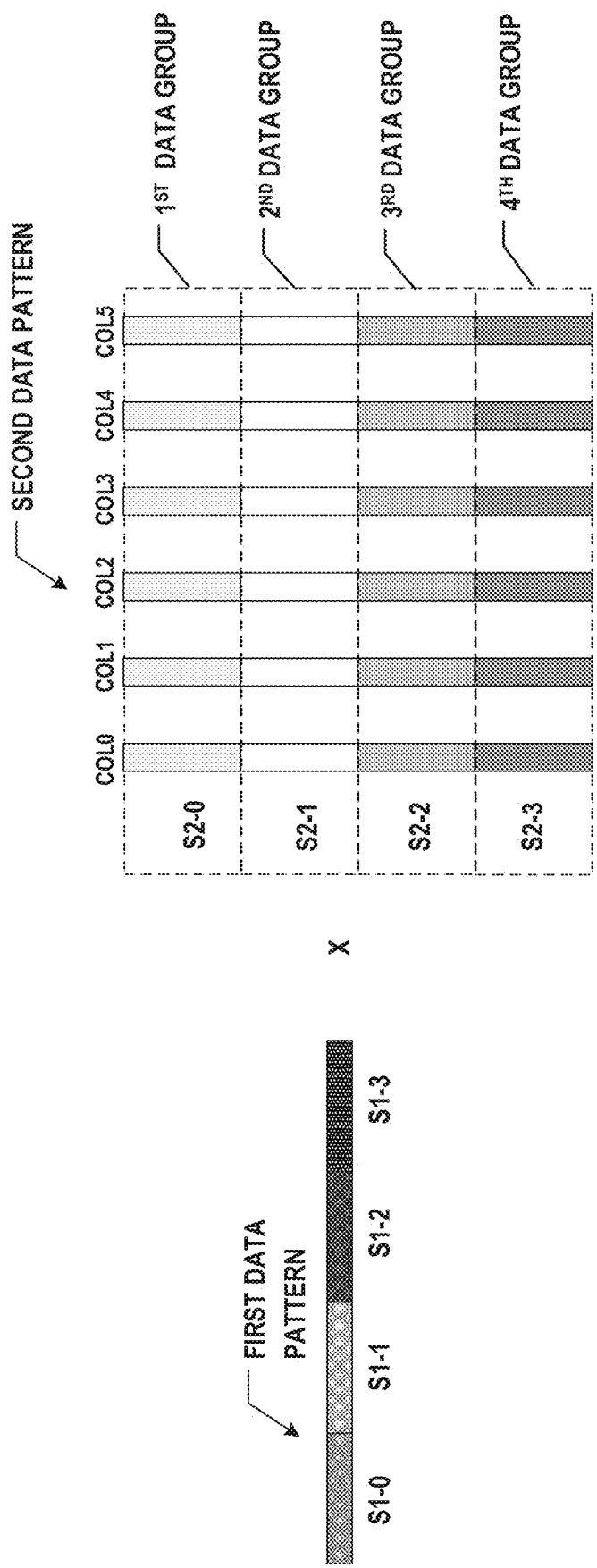
FIG. 2C illustrates a first data pattern and a second data pattern used for processing the first data and the second data in FIG. 2A respectively, according to some aspects of the present disclosure.
Figure 2D:
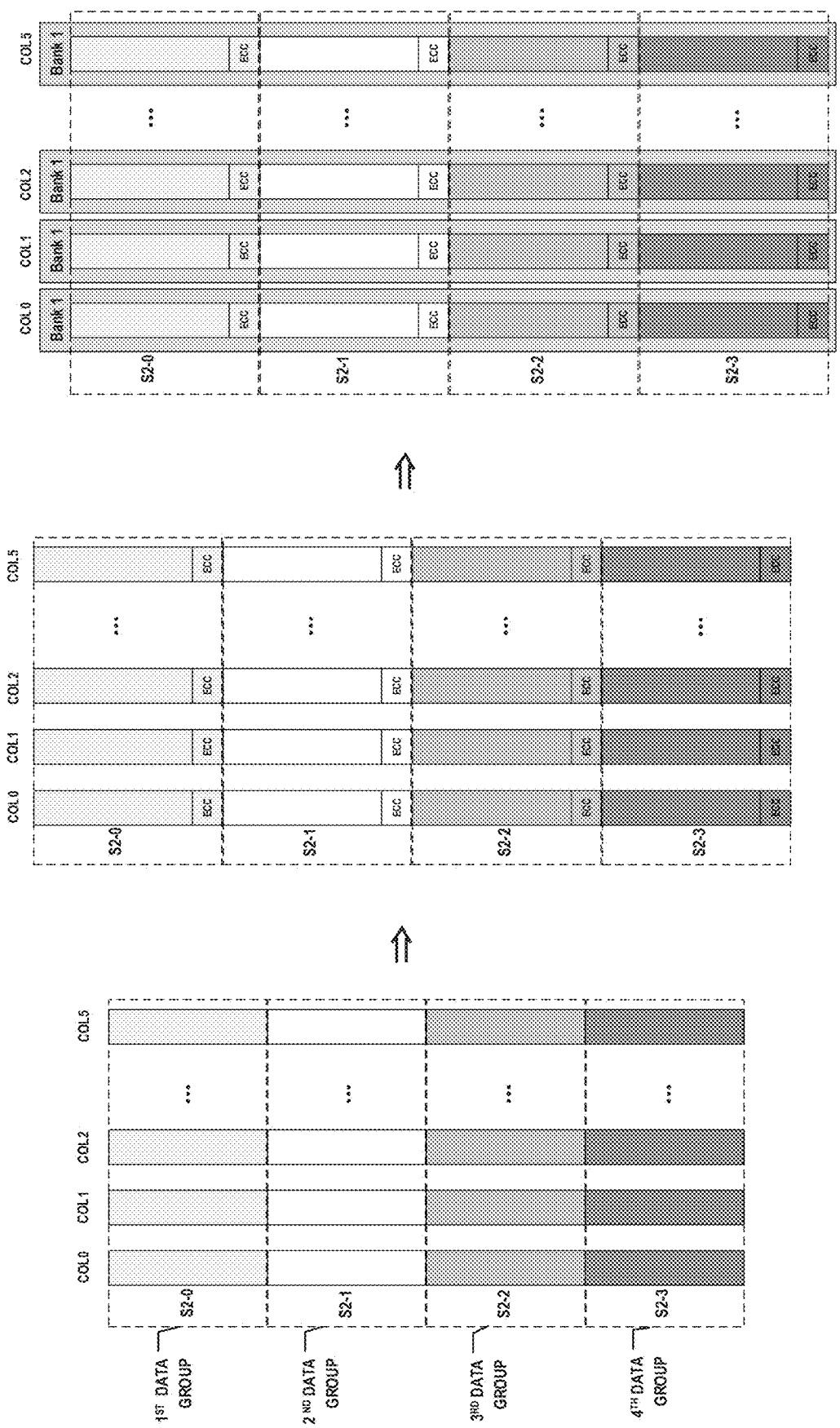
FIG. 2D illustrates a storage map of the second data in FIG. 2A based on the second data pattern in FIG. 2C, according to some aspects of the present disclosure.

In some implementations, the first data and second data can be obtained from data interface 79 of the memory device and be programmed into the plurality of banks of memory cells of memory cell array 62. For example, first data can be saved in one bank 66 of memory cells of the plurality of banks 66 of memory cells of memory cell array 62, and second data can be saved in other banks 66 of memory cells of the plurality of banks 66 of memory cells of memory cell array 62. The first data can be updated after each calculation. The second data can be saved in banks 66 of memory cells for a plurality of calculations with different first data and be updated according to instructions from host 20. In some implementations, the first data and second data can be programmed into the banks of memory cells based on a first data pattern and a second data pattern as shown in FIG. 2C.

In some implementations, refer to FIG. 1A, the second data may be stored in non-volatile memory devices 34. Memory controller 32 may read the second data from the non-volatile memory devices 34 and programmed the second data to volatile memory device 36 before performing calculation. The second data may be stored in non-volatile memory devices 34 in accordance with the second data pattern, or be programmed into volatile memory device 36, i.e., the banks of memory cells, in accordance with the second data pattern.

In some implementations, the first data includes one row, and control logic 75 is configured to program the row of the first data into one bank of the plurality of banks of memory cells based on a first data pattern. For example, the first data can be programmed into Bank 1 of the plurality of banks of memory cells as shown in FIG. 1F. The first data pattern includes N first data segments with equal length, where N is a positive integer and N≥2. In the present implementation, N=4 is taking as an example to illustrate the present disclosure. The first data includes four first data segments based on the first data pattern, i.e., first data segment S1-0, first data segment S1-1, first data segment S1-2, and first data segment S1-3. The sequence of the four first data segments of the first data pattern is the same as a sequence of the first data. In some implementations, the data length of each first data segment is less than or equal to the bandwidth of the data-path bus. In some implementations, an error checking and correcting (ECC) code is assigned to each first data segment for verification. The ECC code can also be employed as an identifier for each first data segment configured to recognize that the first data pattern is applied on the first data.

In some implementations, the second data includes M columns, where M is a positive integer and M≥2. Control logic 75 is configured to program each column of the M columns into the M banks of memory cells of the plurality of banks of memory cells based on a second data pattern, a number of the plurality of banks of memory cells is larger than M. In some implementations, as shown in FIG. 1F, a number of banks of memory cells of memory cell array 62 is sixteen, and a number of the columns of the second data is six, as shown in FIG. 2B. Then the six columns of the second data can be programmed into six banks of memory cells of the sixteen memory banks. For example, Column 0 can be programmed into Bank 2, Column 1 can be programmed into Bank 3, Column 2 can be programmed into Bank 4, Column 3 can be programmed into Bank 5, Column 4 can be programmed into Bank 6, and Column 5 can be programmed into Bank 7.

The second data pattern includes N data groups each having M second data segments with equal data length from the M columns of the second data respectively, and the first data segment and the second data segment are configured to share an equal data length. In some implementations, N=4 and M=6 are taking as examples to illustrate the present disclosure. As shown in FIG. 2C, the second data includes six columns; each column of the six columns includes four second data segments, i.e., second data segment S2-0, second data segment S2-1, second data segment S2-2, and second data segment S2-3. Referring to FIG. 2C, the six second data segments S2-0 are regrouped as a first data group of the second data pattern, the six second data segments S2-1 are regrouped as a second data group of the second data pattern, the six second data segments S2-2 are regrouped as a third data group of the second data pattern, and the six second data segments S2-3 are regrouped as a fourth data group of the second data pattern. Each second data segment of one data group is programmed into different memory banks. For example, the first data group includes second data segment S2-0 from Column 0 programmed into Bank 2, second data segment S2-0 from Column 1 programmed into Bank 3, second data segment S2-0 from Column 3 programmed into Bank 5, second data segment S2-0 from Column 4 programmed into Bank 6, and second data segment S2-0 from Column 5 programmed into Bank 7. In some implementations, an error checking and correcting (ECC) code is assigned to each second data segment for verification. The ECC code can also be employed as an identifier for each second data segment configured to recognize that the second data pattern is applied on the second data.

Figure 3A:
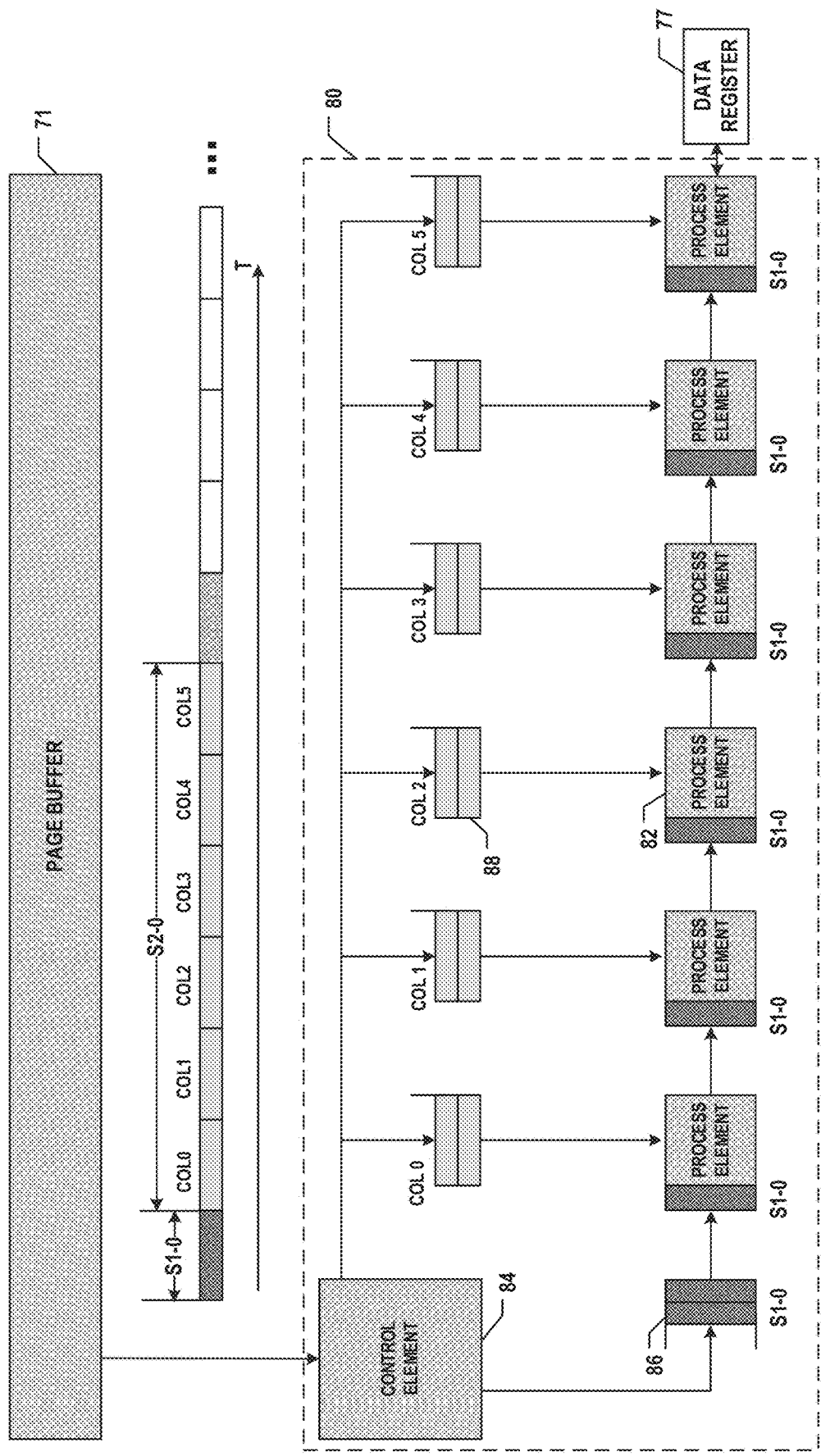
FIG. 3A illustrates a data flow in a process unit of the memory device, according to some aspects of the present disclosure.
Figure 3B:
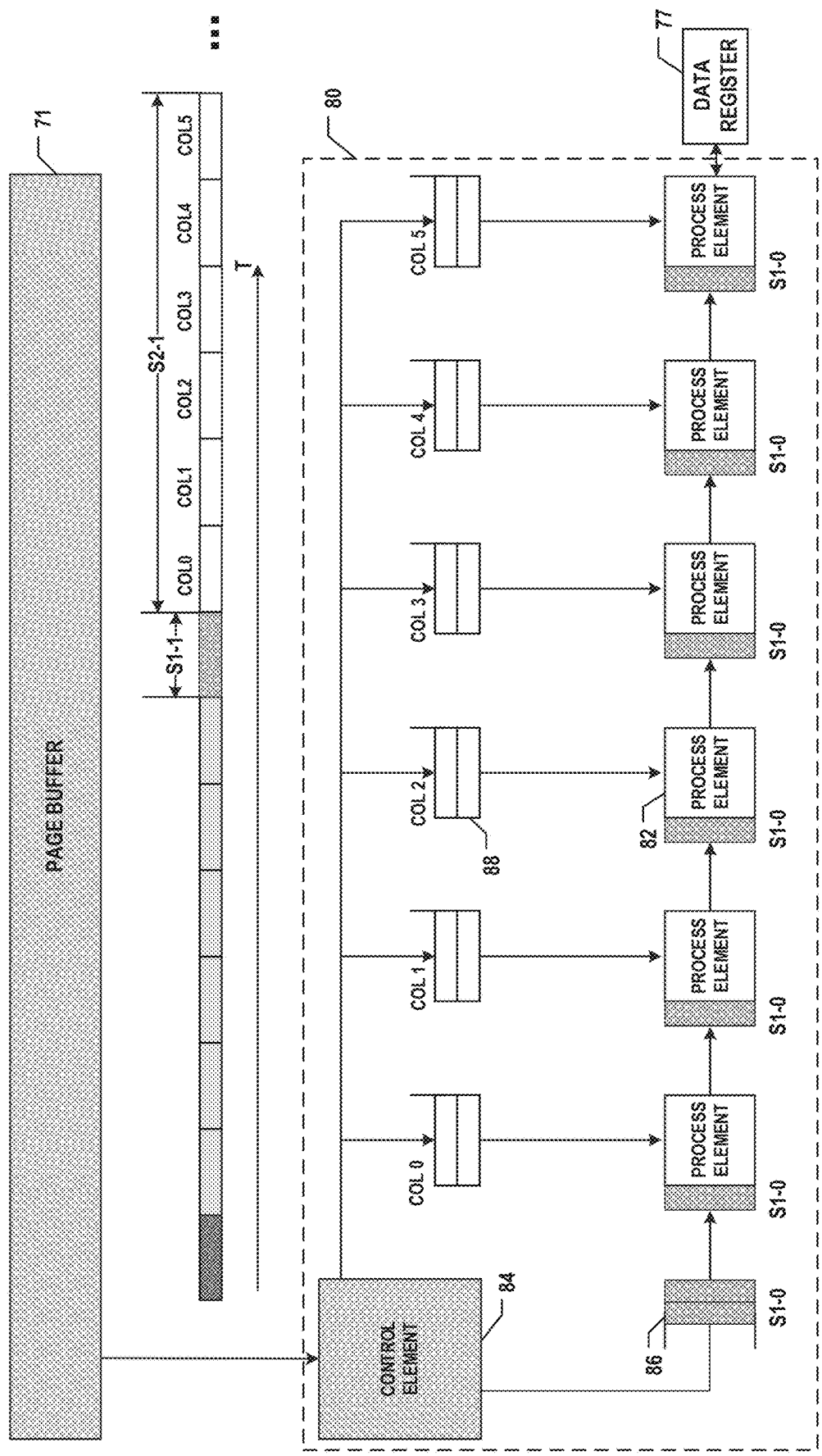
FIG. 3B illustrates a data flow in a process unit of the memory device, according to some aspects of the present disclosure.

In some implementations, control logic 75 is further configured send the first data from the plurality of banks of memory cells to at least one process unit 80 based on the data sequence of the first data pattern in FIG. 2C. For example, first data segment S1-0 is sent to process unit 80 at first as shown in FIG. 3A, and first data segment S1-1 is sent to process unit 80 after first data segment S1-0 consecutively as shown in FIG. 3B. First data segment S1-2 and first data segment S1-3 are s sent to process unit 80 consecutively after first data segment S1-1 (not shown). Taking first data segment S1-0 as an example, in some implementations, first data segment S1-0 is sent to and cached in first register 86. In some implementations, each process unit 80 includes a control element 84 configured to assign the first data segment S1-1 to each process element 82, as shown in FIG. 3A.

In some implementations, control logic 75 is further configured to send the N data groups of the second data from the plurality of banks of memory cells to the at least one process unit 80 based on the data sequence of the second data pattern in FIG. 2C. For example, the six second data segments S2-0 of the first data group are sensed and sent process unit 80 at first as shown in FIG. 3A, and the six second data segments S2-1 of the second data group are sensed and sent process unit 80 after the first data group consecutively as shown in FIG. 3B. The six second data segments S2-2 of the third data group of the second data are sensed and sent process unit 80 consecutively after the second data group, and the six second data segments S2-3 of the fourth data group of the second data are sensed and sent process unit 80 consecutively after the third data group (not shown). Taking the six second data segments S2-0 as an example, in some implementations, the six second data segments S2-0 are sent to and cached in the six second register 88. In some implementations, control element 84 is configured to assign the six second data segments S2-1 to the six process elements correspondingly based on the sequence of the six second data segments S2-1, as shown in FIG. 3A.

In some implementations, the M process elements 82 of each process unit 80 is configured to perform convolution operations based on an ith first data segment of the N first data segments and the M second data segments of an ith data group of the N data groups, where i is a positive integer and N≥i≥1. Referring to FIG. 3A and FIG. 3B, in the present implementation, the first data segment S1-0 is sent to each of the six process elements 82, the six second data segments S2-0 of the first data group of the second data are sent to the six process elements 82 correspondingly, and convolution operations are performed by the six process elements 82 based on the first data segment S1-0 and the six second data segments S2-0 and obtain a first calculation result. The first calculation result is then sent to data interface 79 by control logic 75 to perform further operations. The first data segment S1-1 and the six second data segments S2-1 are then sent to the six process elements 82 to perform convolution operations and generate a second calculation result. The second calculation result is then sent to data interface 79 by control logic 75 consecutively. In some implementations, each of the calculation results may be saved in the result register of the corresponding process element, the data register 77 of peripheral circuit 64, or be saved in to one or more banks 66 of memory cells of the memory cell array 62.

Figure 4:
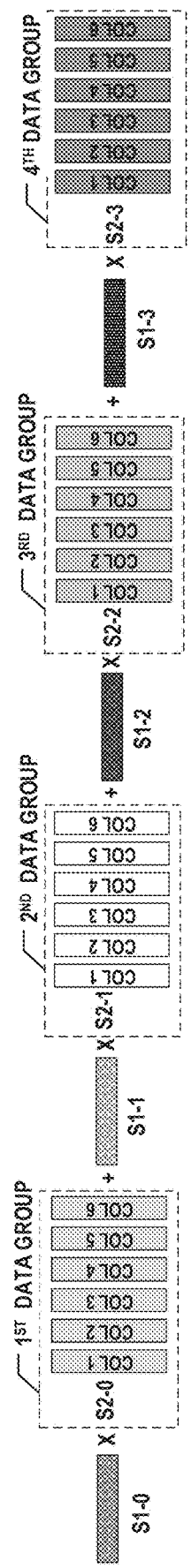
FIG. 4 illustrates a process used for processing the first data and the second data in FIG. 2A based on the first data pattern and the second data pattern in FIG. 2C, according to some aspects of the present disclosure.

A calculation principle of the at least one process unit is provided in FIG. 4, in which the ith first data segment is multiplied with the M second data segments of an ith data group of the N data groups to obtain an ith result. The N ith results are accumulated to obtain a convolution result. In some implementations, peripheral circuit 70 includes one process unit 80, then the convolution operations between the calculations N first data segments and the N data groups of the second data are performed by the one process unit 80 consecutively. In some implementations, peripheral circuit 70 includes more than one process unit 80, then the convolution operations between the calculations N first data segments and the N data groups of the second data are performed by different process unit 80 at the same time respectively.

At least one process unit 80 is set within peripheral circuit 70 independently and is a separate module. With an increasement of a number of the at least one process unit 80 within peripheral circuit 70, the calculation speed of peripheral circuit 70 improved while a larger area of peripheral circuit 70 is needed, there is a trade-off between the calculation speed and the area of peripheral circuit 70. In some implementations, memory cell array 62 is divided into more than one plane of memory cells, each plane includes a plurality of memory cells. The number of the at least one process unit 80 is equal to a number of the banks of memory cells, which means that the at least one process unit 80 corresponds to the plurality of banks of memory cells correspondingly. For example, memory cell array 62 is divided into 128 banks of memory cells, and the number of at least one process unit 80 is also 128. In some implementations, the number of the at least one process unit 80 is less than a number of the banks of memory cells. For example, memory cell array 62 is divided into 128 banks of memory cells, and the number of at least one process unit 80 may be 100, 64, 50, or other numbers less than 128. In some implementations, the number of at least one process unit 80 is half of the number of the banks of memory cells, and one process unit corresponds to two banks of memory cells respectively. For example, memory cell array 62 is divided into 128 banks of memory cells, and the number of at least one process unit 80 is 64. In some implementations, the number of at least one process unit 80 is a quarter of the number of the banks of memory cells, and one process unit corresponds to four banks of memory cells respectively. For example, memory cell array 62 is divided into 128 banks of memory cells, and the number of at least one process unit 80 is 32. The number of at least one process unit 80 can be set and adjusted based on the need of the AI system, the implementations of the present disclosure aim to illustrate the present disclosure and should not be explained as limitations.

In another aspect of the present disclosure, control logic 75 of peripheral circuit 70 is configured to send the first data and the second data from the plurality of banks of memory cells to the at least one process unit 80.

Figure 5:
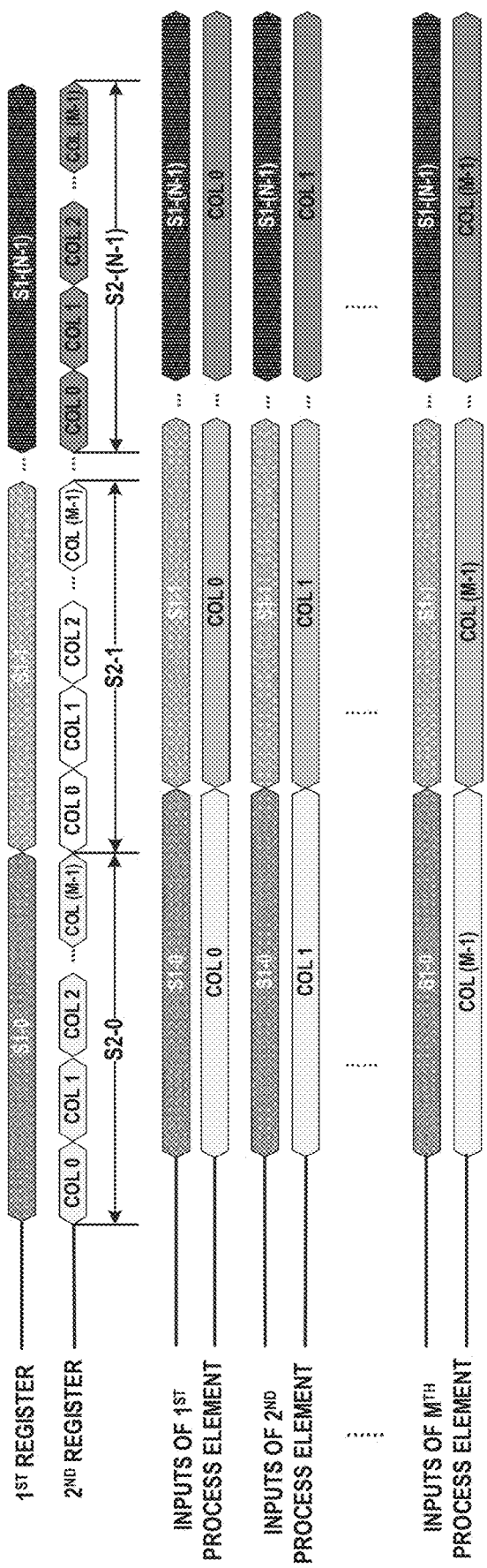
FIG. 5 illustrates an operation pipeline of the memory device, according to some aspects of the present disclosure.

Referring to FIG. 5, operation pipeline of one process unit 80 is illustrated. The N first data segments of the first data can be sent to first register 86 consecutively as shown in FIG. 5. A sequence of the N first data segments of the first data pattern is same with a sequence of the first data. The data length of each first data segment is less than or equal to the bandwidth of data-path bus 81. The N data groups of the second data can be sent to second registers 88 consecutively as shown in FIG. 5. A sequence of the N data groups of the second data pattern is same with a sequence of the second data. The M second data segments within a same data group are arranged according to the order of the M columns of the second data. The first data segment and the second data segment are configured to share an equal data length.

In some implementations, the operation pipeline shown in FIG. 5 is performed by at least one process element 82 of each process unit 80. In some implementations, a number of the process elements 82 equals to the number of the columns of the second data M. Control logic 75 is configured to send the ith first data segment to each process element 82 and send the M second data segments of the ith data group of the second data to the M process elements 82 correspondingly, as shown in FIG. 5. Each of the at least one process unit 80 includes a control element 84 configured to assign the M second data segments to the M process elements correspondingly based on the sequence of the M second data segments.

Referring to FIG. 3A and FIG. 5, the input of first register 86, second register 88, and the M process elements 82 are illustrated. First data segment S1-0, first data segment S1-1, . . . , and first data segment S1-(N−1) are sent into first register 86 consecutively while the M second data segments S2-0 of the first data group, M second data segments S2-1 of the second data group, . . . , M second data segments S2-(N−1) of the Nth data group are sent into second register 88 correspondingly. First data segment S1-0 is assigned to each of the M process elements, while M second data segments S2-0 are assigned to a corresponding process element under the control of the control element 84 as shown in FIG. 5. For example, second data segment S2-0 from Column 0 is assigned to the first process element, second data segment S2-0 from Column 1 is assigned to the second process element, and second data segment S2-0 from Column (M−1) is assigned to the Mth process element, as shown in FIG. 5. A first calculation is then performed by the M process elements 82 and a first result is generated based on first data segment S1-0 and the M second data segments S2-0. The first result is copied and sent to the data register 77 by control logic 75.

Referring to FIG. 3B and FIG. 5, first data segment S1-1 is sent to first register 86 consecutively while the M second data segments S2-1 of the first data group are sent to second register 88 correspondingly. Then the first data segment S1-1 can be assigned to each of the M process elements, and the M second data segments S2-1 can be assigned to a corresponding process element under the control of the control element 84. For example, second data segment S2-1 from Column 0 is assigned to the first process element, second data segment S2-1 from Column 1 is assigned to the second process element, and second data segment S2-1 from Column (M−1) is assigned to the Mth process element, as shown in FIG. 5. A second calculation is performed by the M process elements 82 based on the first data segment S1-1, the M second data segments S2-1, and the first result to generate a second result. The first result is copied and sent to the data register 77 by control logic 75.

Consecutively, referring to FIG. 5, first data segment S1-(N−1) is sent to first register 86 while the M second data segments S2-(N−1) of the first group are sent to second register 88 consecutively. Then the first data segment S1-(N−1) can be assigned to each of the M process elements, and the M second data segments S2-(N−1) can be assigned to a corresponding process element under the control of the control element 84. For example, second data segment S2-(N−1) from Column 0 is assigned to the first process element, second data segment S2-(N−1) from Column 1 is assigned to the second process element, and second data segment S2-(N−1) from Column (M−1) is assigned to the (M−1) th process element, as shown in FIG. 5. An (N−1)th calculation is performed by the M process elements 82 based on the first data segment S1-(N−1), the M second data segments S2-(N−1), and the (N−2) th result to generate an Nth result. The Nth result is copied and sent to the data register 77 by control logic 75.

A system including a memory device and a controller is provided. The memory device includes a plurality of banks of memory cells and a peripheral circuit coupled to the memory cells. The peripheral circuit includes a control logic configured to program first data and second data into the plurality of memory banks; at least one process unit configured to perform calculation based on the first data and the second data; and a data-path bus coupled to the control logic and the at least one process unit to transmit the first date and the second data. The controller is coupled with the memory device and configured to transmit the first data into the memory device and receive a result of the calculation from the memory device.

In some implementations, the system can be any electrical system applied with an AI system, such as computers, digital cameras, mobile phones, smart electrical appliances, Internet of Things (IoT), servers, base stations, and the like. In the present disclosure, data processing and computing of the AI system can be performed by process units 80 of peripheral circuit of a memory device. In some implementations, computing tasks consuming a large number of resources can be distributed to memory device rather than the TPU or a graphic processing unit (GPU) by adding at least one process unit into the memory device to improve the performance of the AI system. The number of process units can be designed based on the needs of the AI system. The more process units are integrated into the memory device, the higher effective the AI system will be.

Figure 6:
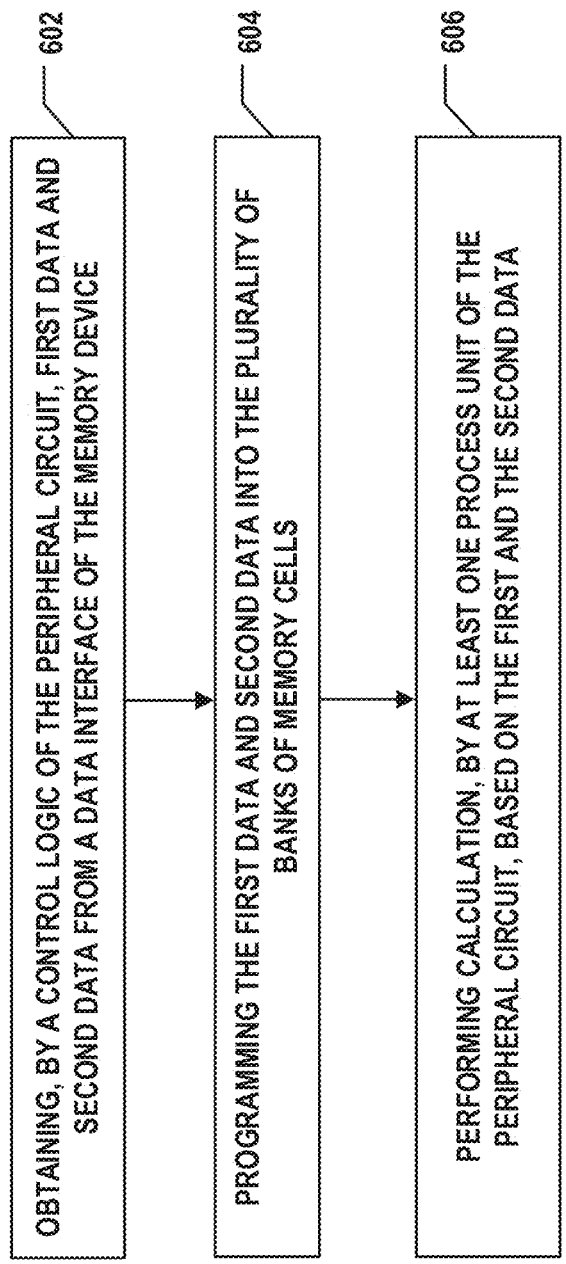
FIG. 6 illustrates a flowchart of a method for data calculation with a memory device, according to some aspects of the present disclosure.

Referring to FIG. 6, FIG. 6 illustrates a flowchart of a method 600 for data calculation with a memory device including array of memory cell array 62 and peripheral circuit 70 coupled to the memory cell array 62, the memory device can be the same as described above and will not be repeated herein. It is understood that the operations shown in method 600 are not exhaustive and that other operations can be performed as well before, after, or between any of the illustrated operations. Further, some of the operations may be performed simultaneously, or in a different order than shown in FIG. 6.

As shown in FIG. 6, method 600 can start at operation 602, in which the first data and the second data are obtained from a data interface of the memory device by a control logic of the peripheral circuit. Method 600 then proceeds to operation 604, in which the first data and the second data are programmed into memory cell array 62 based on preset data patterns.

In some implementations, the first data may be one-dimensional data and the second data may be two-dimensional data in many cases, as shown in FIG. 2A, in which the first data is a one-dimensional vector, and the second data is a two-dimensional matrix. In some implementations, the one-dimensional first data can be equivalated as a row of data with a length of a, and the two-dimensional second data, i.e., the a×b matrix, can be equivalated as b columns, each column has a length of a. In some implementations, the first data can be a two-dimensional matrix including more than one row with an equal data length, and a dimensionality reduction can be performed on the more than one row of the first data to break the first data into a plurality of single row to apply the present disclosure.

In some implementations, the first data and second data can be programmed into memory cell array 62 on a first data pattern and a second data pattern as shown in FIG. 2C.

In some implementations, the first data includes one row. The row of the first data is programmed into one bank of the plurality of banks of memory cells based on a first data pattern. For example, the first data can be programmed into Bank 0 of the plurality of banks of memory cells as shown in FIG. 1F. The first data pattern includes N first data segments with equal length, where N is a positive integer and N≥2. In the present implementation, N=4 is taking as an example to illustrate the present disclosure. The first data includes four first data segments based on the first data pattern, i.e., first data segment S1-0, first data segment S1-1, first data segment S1-2, and first data segment S1-3. The four first data segments are programmed into Bank 1 consecutively. The sequence of the four first data segments of the first data pattern is the same as a sequence of the first data. In some implementations, the data length of each first data segment is less than or equal to the bandwidth of the data-path bus. In some implementations, an error checking and correcting (ECC) code is assigned to each first data segment for verification. The ECC code can also be employed as an identifier for each first data segment configured to recognize that the first data pattern is applied on the first data.

In some implementations, the second data includes M columns, where M is a positive integer and M≥2. Each column of the M columns is programmed into the M banks of memory cells of the plurality of banks of memory cells based on a second data pattern, a number of the plurality of banks of memory cells is larger than M. In some implementations, as shown in FIG. 1F, a number of banks of memory cells of memory cell array 62 is sixteen, and a number of the columns of the second data is six, as shown in FIG. 2B. Then the six columns of the second data can be programmed into six banks of memory cells of the sixteen memory banks. For example, Column 0 can be programmed into Bank 1, Column 1 can be programmed into Bank 2, Column 2 can be programmed into Bank 3, Column 3 can be programmed into Bank 4, Column 4 can be programmed into Bank 5, and Column 5 can be programmed into Bank 6.

The second data pattern includes N data groups each having M second data segments with equal data length from the M columns of the second data respectively, and the first data segment and the second data segment are configured to share an equal data length. In some implementations, N=4 and M=6 are taking as examples to illustrate the present disclosure. As shown in FIG. 2C, the second data includes six columns; each column of the six columns includes four second data segments, i.e., second data segment S2-0, second data segment S2-1, second data segment S2-2, and second data segment S2-3. Referring to FIG. 2C, the six second data segments S2-0 are regrouped as a first data group of the second data pattern, the six second data segments S2-1 are regrouped as a second data group of the second data pattern, the six second data segments S2-2 are regrouped as a third data group of the second data pattern, and the six second data segments S2-3 are regrouped as a fourth data group of the second data pattern. Each second data segment of one data group is programmed into different memory banks. For example, the first data group includes second data segment S2-0 from Column 0 programmed into Bank 2, second data segment S2-0 from Column 1 programmed into Bank 3, second data segment S2-0 from Column 3 programmed into Bank 5, second data segment S2-0 from Column 4 programmed into Bank 6, and second data segment S2-0 from Column 5 programmed into Bank 7. In some implementations, an error checking and correcting (ECC) code is assigned to each second data segment for verification. The ECC code can also be employed as an identifier for each second data segment configured to recognize that the second data pattern is applied on the second data.

As shown in FIG. 6, method 600 can start at operation 606, in which calculation is performed by at least one process unit of the peripheral circuit based on the first and the second data.

In some implementations, each row of the first data is sensed and sent to the at least one process unit 80 based on the data sequence of the first data pattern in FIG. 2C. For example, first data segment S1-0 is sent into process unit 80 at first as shown in FIG. 3A, and first data segment S1-1 is sent into process unit 80 after first data segment S1-0 consecutively as shown in FIG. 3B. First data segment S1-2 and first data segment S1-3 are sent into process unit 80 consecutively after first data segment S1-1 (not shown). Taking first data segment S1-0 as an example, in some implementations, first data segment S1-0 is sent to and cached in the first register 86. In some implementations, the first data segment S1-1 is assigned to each process element 82 by control element 84 of each process unit, as shown in FIG. 3A.

In some implementations, the data groups of the second data pattern are sensed and sent to the at least one process unit 80 based on the data sequence of the second data pattern in FIG. 2C. For example, the six second data segments S2-0 of the first data group are sent into process unit 80 at first as shown in FIG. 3A, and the six second data segments S2-1 of the second data group are sent into process unit 80 after the first data group consecutively as shown in FIG. 3B. The six second data segments S2-2 of the third data group of the second data are sent into process unit 80 consecutively after the second data group, and the six second data segments S2-3 of the fourth data group of the second data are sent into process unit 80 consecutively after the third data group (not shown). Taking the six second data segments S2-0 as an example, in some implementations, the six second data segments S2-0 are sent to and cached in the six second register 88. In some implementations, each process unit includes a control element configured to assign the six second data segments S2-0 to the six process elements correspondingly based on the sequence of the six second data segments S2-0, as shown in FIG. 3A.

In some implementations, operation 606 includes performing convolution operations by the M process elements 82 of each process unit 80 based on an ith first data segment of the N first data segments and the M second data segments of an ith data group of the N data groups, where i is a positive integer and N≥i≥1. Referring to FIG. 3A and FIG. 3B, in the present implementation, the first data segment S1-0 is sent to each of the six process elements 82, the six second data segments S2-0 of the first data group of the second data are sent to the six process elements 82 correspondingly, and convolution operations are performed by the six process elements 82 based on the first data segment S1-0 and the six second data segments S2-0 and obtain a first calculation result. The first calculation result is then sent to data interface 79 by control logic 75. The first data segment S1-1 and the six second data segments S2-1 are then sent to the six process elements 82 to perform convolution operations and generate a second calculation result. The second calculation result is then sent to data interface 79 by control logic 75 consecutively. In some implementations, each of the calculation results may be saved in the result register of the corresponding process element, the data register 77 of peripheral circuit 64, or be saved in to one or more banks 66 of memory cells of the memory cell array 62.

A calculation principle of the at least one process unit is provided in FIG. 5, in which the ith first data segment is multiplied with the M second data segments of an ith data group of the N data groups to obtain an ith result. The N ith results are accumulated to obtain a convolution result. In some implementations, peripheral circuit 70 includes one process unit 80, then the convolution operations between the calculations N first data segments and the N data groups of the second data are performed by the one process unit 80 consecutively. In some implementations, peripheral circuit 70 includes more than one process unit 80, then the convolution operations between the calculations N first data segments and the N data groups of the second data are performed by different process unit 80 at the same time respectively.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described implementations but should be defined only in accordance with the following claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A memory device comprising:
   banks of memory cells; and
   a peripheral circuit coupled to the banks of memory cells and comprising:
      a control logic configured to program first data and second data into different banks of the banks of memory cells;
      at least one process unit coupled to the banks of memory cells via a data-path bus of the peripheral circuit, and configured to perform calculation based on the first data and the second data; wherein
   the first data is programmed into N first data segments, wherein N is a positive integer and N≥2; and
   the second data is programmed into N data groups, each data group comprising M second data segments, wherein M is a positive integer and M≥2.

2. The memory device of claim 1, wherein
   the first data comprises at least one row; and
   the control logic is configured to:
      receive the first data from a data interface; and
      program each row of the first data into one bank of the banks of memory cells.

3. The memory device of claim 2, wherein
   data lengths of the N first data segments are equal; and
   an order of the N first data segments remains an original order of the first data segments located in the first data.

4. The memory device of claim 3, wherein the data length of each first data segment is less than or equal to a bandwidth of the data-path bus.

5. The memory device of claim 3, wherein
   the second data comprises M columns; and
   the control logic is configured to program each column of the M columns into M banks of memory cells of the banks of memory cells based, a number of the banks of memory cells is larger than M.

6. The memory device of claim 5, wherein
   date lengths of the first data segments and data lengths of the second data segments are equal.

7. The memory device of claim 6, wherein each second data segment is assigned with an error checking and correcting (ECC) code.

8. The memory device of claim 6, wherein the data length of each second data segment is less than or equal to a bandwidth of the data-path bus.

9. The memory device of claim 6, wherein the control logic is configured to receive the second data from the data interface of the memory device.

10. The memory device of claim 6, wherein each of the at least one process unit comprises M process elements and is configured to perform convolution operations based on an ith first data segment of the N first data segments and the M second data segments of an ith data group of the N data groups, where i is a positive integer and N≥i≥1.

11. The memory device of claim 10, wherein the control logic is configured to:
   control the one bank of the banks of memory cells to send the ith first data segment of the first data to each process element of the M process elements; and control the M banks of memory cells to send the M second data segments to the M process elements.

12. The memory device of claim 11, wherein each of the at least one process unit comprises a control element configured to assign the M second data segments to the M process elements correspondingly based on an order of the M second data segments originally located in the second data.

13. The memory device of claim 12, wherein the control logic is configured to output a calculation result to a data interface of the peripheral circuit of the memory device or the banks of memory cells.

14. The memory device of claim 13, wherein a number of the at least one process unit is equal to or less than a number of the banks of memory cells.

15. The memory device of claim 1, wherein the memory device comprises dynamic random-access memory (DRAM).

16. A method for data calculation with a memory device comprising banks of memory cells and a peripheral circuit coupled to the banks of memory cells, comprising:
obtaining, by a control logic of the peripheral circuit via a data-path bus of the peripheral circuit, first data and second data from a data interface of the memory device;
programming the first data and second data into the banks of memory cells; and
performing calculation, by at least one process unit of the peripheral circuit, based on the first and the second data; wherein
the first data is programmed into a number N of first data segments, wherein N is a positive integer and N≥2; and
the second data is programmed into the number N of data groups, each data group comprising a number M of second data segments, wherein M is a positive integer and M≥2.

17. The method of claim 16, wherein
the first data comprises at least one row;
programming the first data and second data into the banks of memory cells comprises:
programming each row of the first data into one memory bank of banks of memory cells; and
an order of the number N of first data segments remains an original order of the first data segments located in the first data.

18. The method of claim 17, wherein
the second data comprises M columns, and obtaining the second data from the data interface of the memory device comprises programming each column of the M columns into M banks of memory cells of the M banks of memory cells, a number of the banks of memory cells is larger than M; and
data lengths of the first data segments and data lengths of the second data segments are equal.

19. The method of claim 18, wherein performing calculation based on the first and the second data comprises:
sending the ith first data segment of the first data from the one memory bank to each process element of the M process elements;
sending the M second data segments from the M banks of memory cells to the M process elements; and
performing, by each M process elements of the at least one process unit, convolution operations based on an ith first data segment of the N first data segments and the M second data segments of an ith data group of the N data groups, where i is a positive integer and N≥i≥1.

20. A system comprising:
a memory device comprising:
banks of memory cells of memory cells; and
a peripheral circuit coupled to the banks of memory cells and comprising:
a control logic configured to program first data and second data into the memory banks;
at least one process unit coupled to the banks of memory cells via a data-path bus of the peripheral circuit, and configured to perform calculation based on the first data and the second data; and
a controller coupled with the memory device and configured to transmit the first data into the memory device and receive a result of the calculation from the memory device; wherein
the first data is programmed into N first data segments, wherein N is a positive integer and N≥2; and
the second data is programmed into N data groups, and each data group comprising M second data segments, wherein M is a positive integer and M≥2.

* * * * *